(12) United States Patent
Onozawa

(10) Patent No.: US 6,790,692 B2
(45) Date of Patent: Sep. 14, 2004

(54) METHOD FOR FABRICATING SEMICONDUCTOR DEVICE

(75) Inventor: Kazutoshi Onozawa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/602,000

(22) Filed: Jun. 24, 2003

(65) Prior Publication Data
US 2004/0063233 A1 Apr. 1, 2004

(30) Foreign Application Priority Data
Sep. 27, 2002 (JP) ........................... 2002-283684

(51) Int. Cl.⁷ .............................................. H01L 21/00
(52) U.S. Cl. ............................. 438/28; 438/31; 257/80
(58) Field of Search ........................... 438/25–34, 110, 438/472, 975, 982; 257/80–99

(56) References Cited

U.S. PATENT DOCUMENTS

| | | |
|---|---|---|
| 5,545,291 A | 8/1996 | Smith et al. |
| 5,783,856 A | 7/1998 | Smith et al. |
| 5,824,186 A | 10/1998 | Smith et al. |
| 5,904,545 A | 5/1999 | Smith et al. |

FOREIGN PATENT DOCUMENTS

| | | |
|---|---|---|
| JP | 11-144307 | 5/1999 |
| JP | 11-149652 | 6/1999 |
| JP | 11-186651 | 7/1999 |

Primary Examiner—Matthew Smith
Assistant Examiner—Calvin Lee
(74) Attorney, Agent, or Firm—McDermott Will & Emery LLP (57) ABSTRACT

Formed first is a template having openings located to correspond to a pattern in which a plurality of semiconductor laser elements are to be arranged. Then, the template is held on the principal surface of a mounting wafer onto which the semiconductor elements are to be arranged. Subsequently, the semiconductor laser elements are dispersed into a fluid, and the semiconductor-laser-element-dispersed fluid is poured over the wafer on which the template is held. In this manner, the semiconductor laser elements are disposed into the respective openings of the template in a self-aligned manner.

9 Claims, 5 Drawing Sheets

METHOD FOR FABRICATING SEMICONDUCTOR DEVICE

BACKGROUND OF THE INVENTION

The present invention relates to methods for fabricating semiconductor devices, and more particularly relates to semiconductor device fabrication methods which enable semiconductor light emitters, such as semiconductor laser devices, to be mounted in a self-aligned manner.

Typical digital-versatile-disc (hereinafter referred to as "DVD") players need to function to play back compact discs (hereinafter referred to as "CDs") in addition to DVDs, and also have to function to replay, and store data on, recordable CDs (CD-Rs) which have become widespread rapidly in recent years.

As a laser for replaying DVDs, a red laser with a wavelength in the 650 nm band is employed, while an infrared laser with a wavelength in the 780 nm band is used as a laser for playing back CDs and CD-R discs. In the currently available DVD players, therefore, two semiconductor laser diodes are incorporated in the form of an array: one is a red semiconductor laser diode for generating a red laser beam and the other is an infrared semiconductor laser diode for generating an infrared laser beam.

With an increasing demand for smaller personal computers and other information equipment, DVD players also need to be reduced further in size and thickness. To that end, it is indispensable to reduce the size and thickness of optical pickup. Methods for reducing optical pickup in size and thickness include optical system simplification.

As a method for simplifying an optical system, integration of a red semiconductor laser diode and an infrared semiconductor laser diode is available. The current DVD players include two optical systems: one for a red semiconductor laser diode and the other for an infrared semiconductor laser diode. Integration of the red semiconductor laser diode and the infrared semiconductor laser diode allows one optical system to be shared, thereby realizing an optical pickup system of smaller size and thickness.

For instance, as one example of the integration of a red semiconductor laser diode and an infrared semiconductor laser diode, a so-called monolithic semiconductor laser diode array which is integrated on a substrate is disclosed in Japanese Laid-Open Publication No. 11-186651.

Japanese Laid-Open Publication Nos. 11-144307 and 11-149652 disclose another example, in which hybrid integration of two semiconductor laser chips, one for a red laser and the other for an infrared laser, enables an optical system to be shared in an optical pickup system.

Nevertheless, in the conventional monolithic two-wavelength laser diode array, the respective active layers of the laser diodes have different compositions and thus have to be grown in different process steps, which results in the problem of low yields. In particular, when high-output laser diodes are monolithically integrated, yields decrease significantly.

Moreover, it is very difficult, in the viewpoint of crystal growth, to monolithically integrate a gallium nitride (GaN)-based blue laser diode, which is used in high density DVDs, and an aluminum gallium indium phosphide (AlGaInP)-based red laser diode, which is used in typical (conventional) DVDs.

The conventional hybrid optical pickup, on the other hand, have the problem that when the red semiconductor laser chip and the infrared semiconductor laser chip are assembled using assembly equipment, it is difficult to adjust and optimize the locations of the active layers of the semiconductor laser chips and the distance between the light emitting points thereof.

In recent years, mounting methods in which a fluidic self-assembly (hereinafter referred to as "FSA") technique is used have been developed as one type of device-mounting method.

In the FSA technology, devices (hereinafter referred to as "function blocks") ranging in size from 10 µm to several hundred µm and having given shapes are suspended into a liquid to form a slurry. The liquid (suspension) in the form of slurry is poured over the surface of a substrate of, e.g., silicon having recessed portions therein. The recessed portions are substantially the same as the function blocks in size and shape. In this manner, the function blocks that have been dispersed in the liquid are engaged into the recessed portions and thereby mounted onto the substrate.

The FSA technology is disclosed in U.S. Pat. Nos. 5,545,291, 5,783,856, 5,824,186 and U.S. Pat. No. 5,904,545, for example.

However, the conventional FSA process has the problem that the formation, by etching, of the recess structure used for the engagement of the function blocks with the substrate is not easy and that the productivity of the mounting substrate is thus low.

SUMMARY OF THE INVENTION

An object of the present invention is therefore that in the fabrication of a semiconductor device formed by hybrid integration of semiconductor chips, the semiconductor chips can be easily and reliably mounted while using the FSA technology.

In order to achieve the object, in inventive semiconductor device fabrication methods, instead of forming in a substrate itself a recess structure into which semiconductor chips are disposed, the semiconductor chips are disposed into openings formed in a template which correspond to a layout pattern for the semiconductor chips.

Specifically, an inventive semiconductor device fabrication method includes the steps of: (a) forming a template having openings that are located to correspond to a pattern in which a plurality of semiconductor elements in the form of chips are to be arranged, (b) holding the template on the principal surface of a substrate on which the semiconductor elements are to be arranged, and (c) spreading the semiconductor elements into a liquid and pouring the semiconductor-element-spread liquid over the substrate on which the template is held, thereby allowing the semiconductor elements to be disposed into the respective openings in the template in a self-aligned manner.

According to the inventive semiconductor device fabrication method, a recess structure, into which the semiconductor elements are disposed, does not have to be formed directly in the principal surface of the substrate on which the semiconductor elements are to be disposed. As described above, since the inventive method employs the template having the openings into which the semiconductor elements are engaged, a recess structure, which is difficult to form, does not have to be formed in the substrate, such that the semiconductor device in which the semiconductor elements are hybridly integrated can be easily and reliably fabricated.

In the inventive semiconductor device fabrication method, in the step (c), it is preferable that the semiconductor-elements dispersed liquid is poured with the template-holding substrate being rotated in its principal surface.

Then, the semiconductor elements are more likely to be settled into the openings of the template, which increases throughput in the mounting process.

The inventive method preferably further includes, before the step (b), the step (d) of forming a plurality of substrate electrodes for making the associated semiconductor elements electrically conductive, on parts of the principal surface of the substrate where the semiconductor elements are to be arranged.

Alternatively, the inventive method preferably further includes, between the steps (b) and (c), the step (d) of forming a plurality of substrate electrodes for making the associated semiconductor elements electrically conductive, on parts of the principal surface of the substrate that are exposed through the openings of the template.

In those cases, the inventive method preferably further includes, after the step (c), the step (e) of securing the semiconductor elements to the associated substrate electrodes, and then removing the template from the substrate. Then, the template, once it is made, can be reused.

In the inventive method, the semiconductor elements are preferably edge-emitting semiconductor laser elements that emit a laser beam from a facet, and in the step (a), the openings of the template are preferably formed so that the respective emission directions of the semiconductor laser elements are aligned in one direction.

Then, only by the disposition of the semiconductor laser elements into the openings of the template, the locations of the respective active layers of the semiconductor laser elements self-align with each other, and the respective light-emitting points of the semiconductor laser elements also self-align with each other at uniform distances. In addition, the semiconductor laser elements are capable of being integrated, even if their constituents (compositions) differ from each other. Further, the openings themselves function to align the emission directions of the semiconductor laser elements, such that wavefront aberration of a spot formed when the resultant semiconductor device is used in an optical pickup system can be reliably within an allowable range.

In this case, in each of the semiconductor laser elements, optical output from a front facet is preferably equivalent in value to optical output from a rear facet.

Then, it is not necessary to select the emission direction in the semiconductor laser elements, which further facilitates the manufacture of the semiconductor device.

In the inventive method, in the step (a), the openings of the template are preferably formed to correspond to the configurations of the semiconductor elements on the side thereof on which the semiconductor elements are disposed.

In that case, the semiconductor elements preferably differ from each other in configuration on the side thereof on which the semiconductor elements are disposed into the associated openings. Then, the semiconductor elements can be selectively disposed into the associated openings of the template.

Further, in that case, the semiconductor elements are preferably semiconductor light emitters, and in the step (a), the openings of the template preferably differ from each other in configuration in accordance with the emission wavelengths of the semiconductor light emitters. Then, if the light emitters are laser emitters, two-wavelength laser chip arrays can be obtained.

Alternatively, in that case, the semiconductor elements are preferably semiconductor light emitters, and in the step (a), the openings of the template preferably differ from each other in configuration in accordance with the optical output values of the semiconductor light emitters. Then, if the light emitters are laser diodes, laser chip arrays in each of which different functions, such as writing and reading, can be performed are obtainable.

BRIEF DESCRIPTION OF THE DRAWINGS

FIGS. 1A through 1C schematically illustrate a semiconductor laser device in accordance with an embodiment of the present invention.

FIGS. 3A and 3B illustrate templates used in semiconductor-laser-device fabrication methods in accordance with the embodiment of the present invention.

DESCRIPTION OF THE PREFERRED EMBODIMENTS

Hereinafter, an embodiment of the present invention will be described with reference to the accompanying drawings.

Figure 1A:
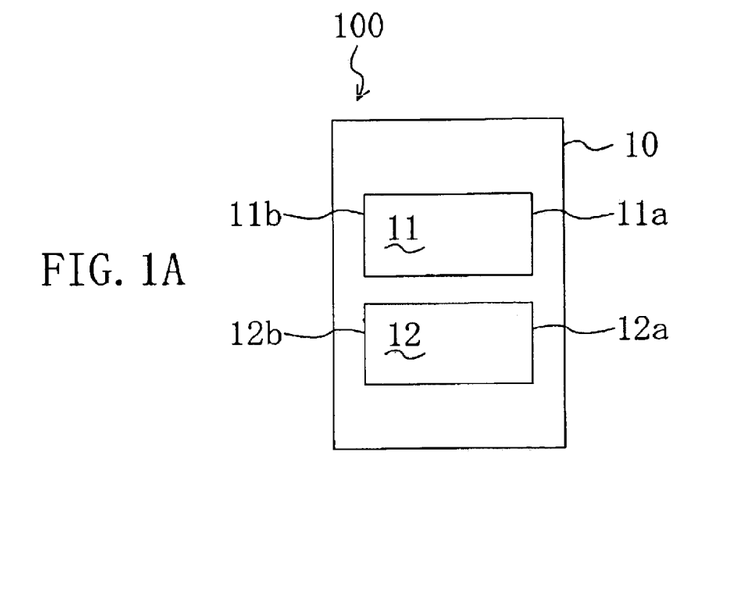
FIG. 1A is a plan view.
Figure 1B:
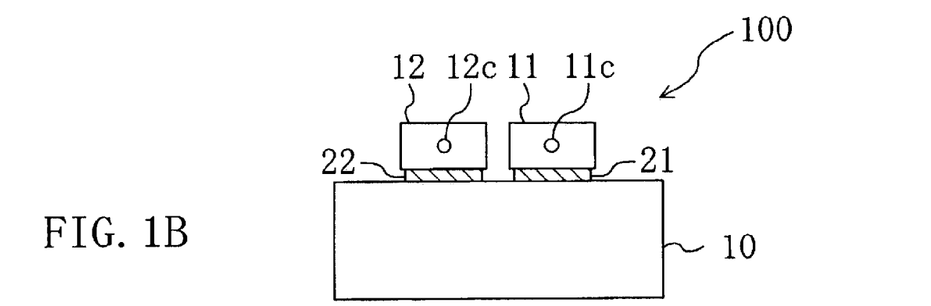
FIG. 1B is a front view, and FIG. 1C a left side view.
Figure 1C:
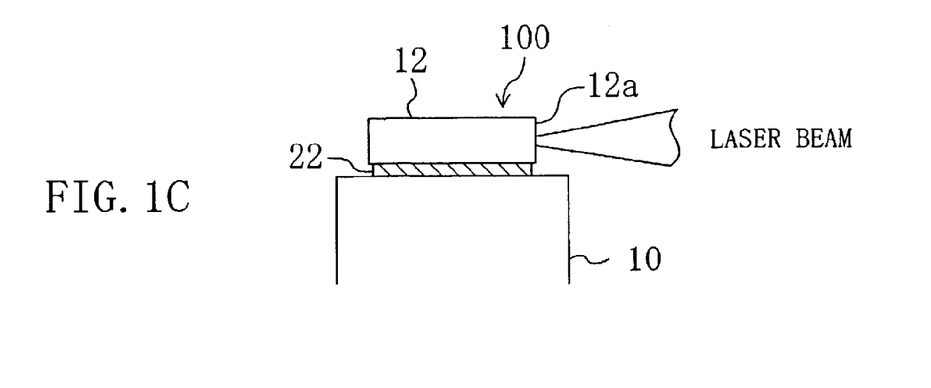

FIGS. 1A through 1C illustrate a semiconductor laser device in accordance with an embodiment of the present invention. FIG. 1A shows a plan configuration, FIG. 1B shows a front configuration, and FIG. 1C shows a left-side configuration.

As shown in FIGS. 1A and 1B, a semiconductor laser device 100 in accordance with this embodiment includes a substrate 10, a first semiconductor laser chip 11, and a second semiconductor laser chip 12. The substrate 10 is made of silicon (Si), for example. The first semiconductor laser chip 11 is held on the principal surface of the substrate 10 with a first substrate electrode 21 being interposed therebetween. The second semiconductor laser chip 12 is held on the principal surface of the substrate 10 with a second substrate electrode 22 being interposed therebetween. The second semiconductor laser chip 12 is located adjacent to the first semiconductor laser chip 11 in such a manner that the respective laser-emission directions of the first and second semiconductor laser chips 11 and 12 are aligned with each other. The first semiconductor laser chip 11 emits an infrared laser beam, for example, and the second semiconductor laser chip 12 emits a red laser beam, for example.

The first and second semiconductor laser chips 11 and 12 are about 120 $\mu$m in height, about 800 $\mu$m in the longitudinal direction (emission direction), and about 300 $\mu$m in the transverse direction.

The material forming the substrate 10 is not limited to silicon, but the substrate 10 may be made of gallium arsenide (GaAs) or silicon carbide (SiC), for example, and is preferably made of material having excellent thermal conductivity. The material forming the substrate 10 may be selected in accordance with the type of function block and the application of the semiconductor laser device 100, for example.

Further, the emission wavelengths of the first and second semiconductor laser chips 11 and 12 are not limited to the above-described combination. For example, any two lasers may be selected from infrared, red, and blue lasers. Moreover, four or more laser chips may be disposed on the principal surface of the substrate 10.

The semiconductor laser device 100 is applicable in an optical pickup system (not shown) for use in the reading or writing of data from or on an optical disc, for example. In this embodiment, the first and second semiconductor laser chips 11 and 12 are both so-called edge-emitting semiconductor laser chips in which a semiconductor layer facet emits a laser beam. As shown in FIGS. 1B and 1C, the first and second semiconductor laser chips 11 and 12 are arranged so that lasers emitted from the respective laser-emitting facets 11a and 12a thereof enter an objective lens incorporated in the optical pickup system. Therefore, the laser-emitting facets 11a and 12a of the first and second semiconductor laser chips 11 and 12 are located to be aligned with each other, and the heights of laser-emitting portions 11c and 12c are equal to each other.

Also, the first and second semiconductor laser chips 11 and 12 may be established in such a manner that optical output from the laser-emitting facet 11a is equivalent in value to optical output from a rear facet 11b, and that optical output from the laser-emitting facet 12a is equivalent in value to optical output from a rear facet 12b.

The respective plan configurations of the first and second semiconductor laser chips 11 and 12 are not limited to a rectangle, but may be varied depending upon the application and function. Specifically, the plan configuration of each function block may be a square or a circle; or a shape having 2-fold rotational symmetry such as a parallelogram, an ellipse, or an oval; or a shape having 1-fold rotational symmetry such as a trapezoid. It should be however noted that in the case of a square or a circle, it becomes slightly difficult to align the respective emission directions of the function blocks.

Moreover, the first and second semiconductor laser chips 11 and 12 may be so structured as to have the same emission wavelength and different optical output values.

Furthermore, the locations of the first and second semiconductor laser chips 11 and 12 in the form of the function bocks are not limited to this embodiment, but may be opposite to each other.

Although not shown, for an upper-surface chip electrode of the chip electrodes formed on each of the first and second semiconductor laser chips 11 and 12, interconnection can be relatively easily established by wire bonding.

(Method for Fabricating Semiconductor Laser Device)

Hereinafter, it will be described how to fabricate a semiconductor laser device 100 having the above-described structure with reference to the accompanying drawings.

First and second semiconductor laser chips 11 and 12 in the form of function blocks can be mounted onto the principal surface of a substrate 10 manually or by conventional assembly equipment, for example. However, an object of the present invention is enabling a plurality of first and second semiconductor laser chips 11 and 12 to be mounted on a substrate 10 using the above-mentioned FSA technology without forming a recess structure in the substrate 10.

Figure 2:
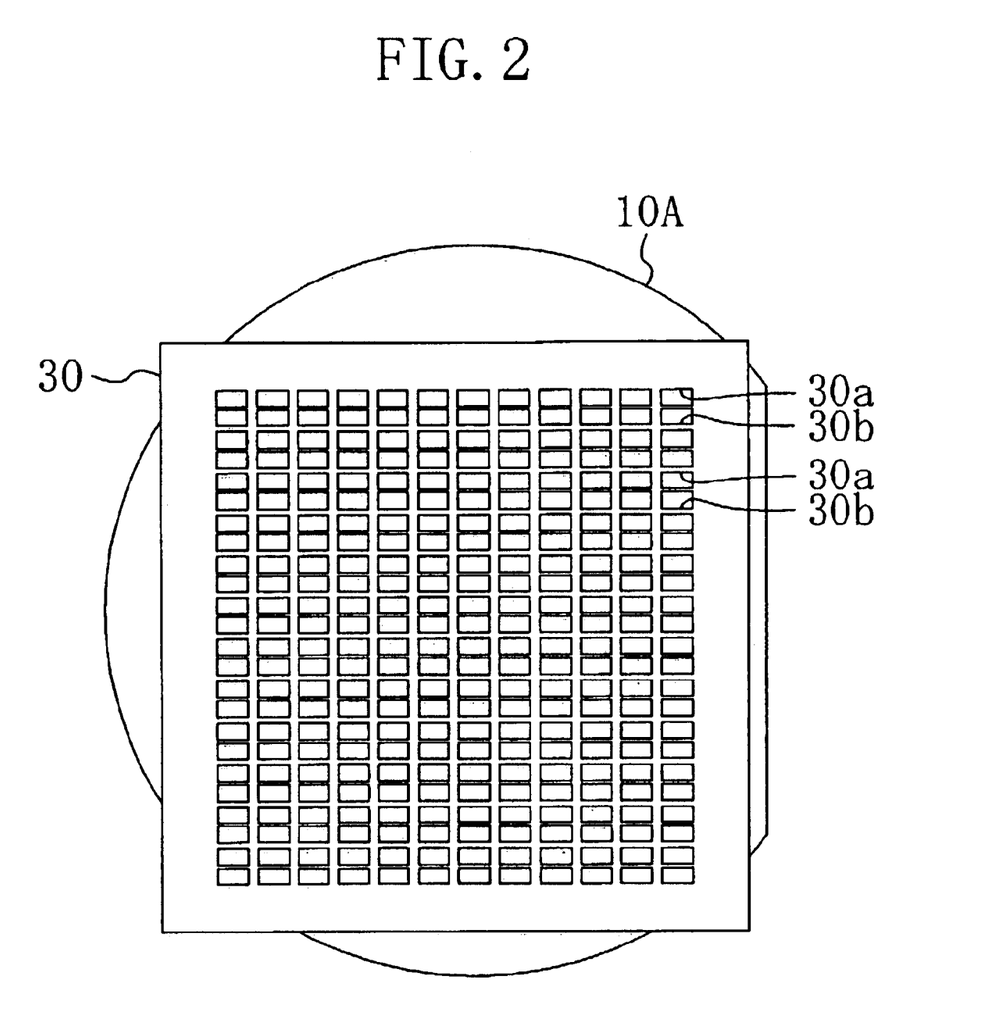
FIG. 2 is a plan view illustrating a mounting wafer, on which a template for determining a layout pattern is held, in a process step in a semiconductor-laser-device fabrication method in accordance with the embodiment of the present invention. The template replaces a recess structure that would be otherwise formed in the wafer.

FIG. 2 shows the plan configuration of a wafer, on which a template for determining an arrangement pattern is held, in a process step in a semiconductor-laser-device fabrication method in accordance with this embodiment. The template replaces a recess structure that would be otherwise formed in the wafer (substrate).

As shown in FIG. 2, a template 30 of nickel (Ni) or its alloy, in which first and second openings 30a and 30b in pairs are formed in the form of an array, is held on the principal surface of a wafer 10A of, e.g., silicon, which is used to mount first and second semiconductor laser chips 11 and 12. The template 30 is held on the wafer 10A by mechanical control or detachable-adhesive bonding, for example. Which method should be chosen from these template-holding methods may be determined depending on the respective types of wafer, function block, and liquid into which the function blocks are dispersed.

The first and second openings 30a and 30b are so formed as to correspond to the pattern shown in FIG. 1A, in which the first and second semiconductor laser chips 11 and 12 are arranged. The thickness of the template 30 is preferably equal to, or smaller than, the height (thickness) of the semiconductor laser chips 11 and 12.

The first and second openings 30a and 30b may be formed by a chemical method, such as etching, or a mechanical method, such as punching. Also, they may be formed by plating or deposition by performing an additive process, for example.

Also, the plan configuration (outer shape) of the template 30 is not limited to a square.

Now, modified examples of the template 30 will be described.

Figure 3A:
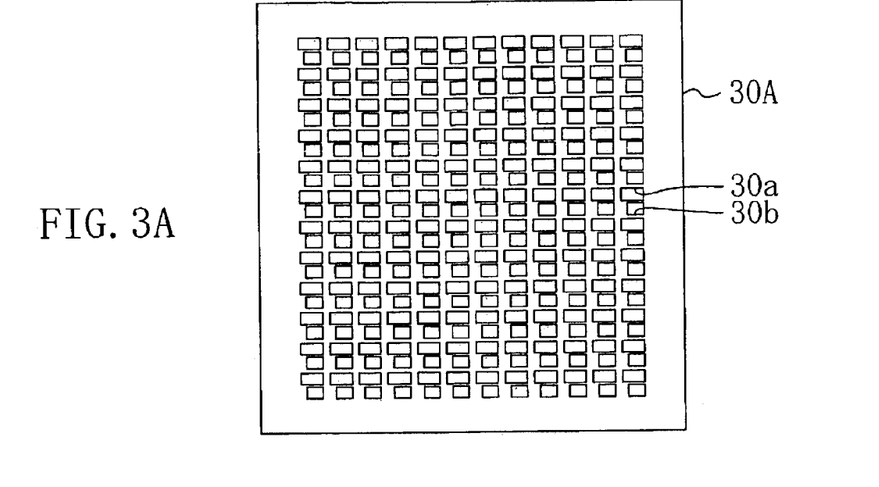
FIG. 3A is a plan view in accordance with a first modified example.
Figure 3B:
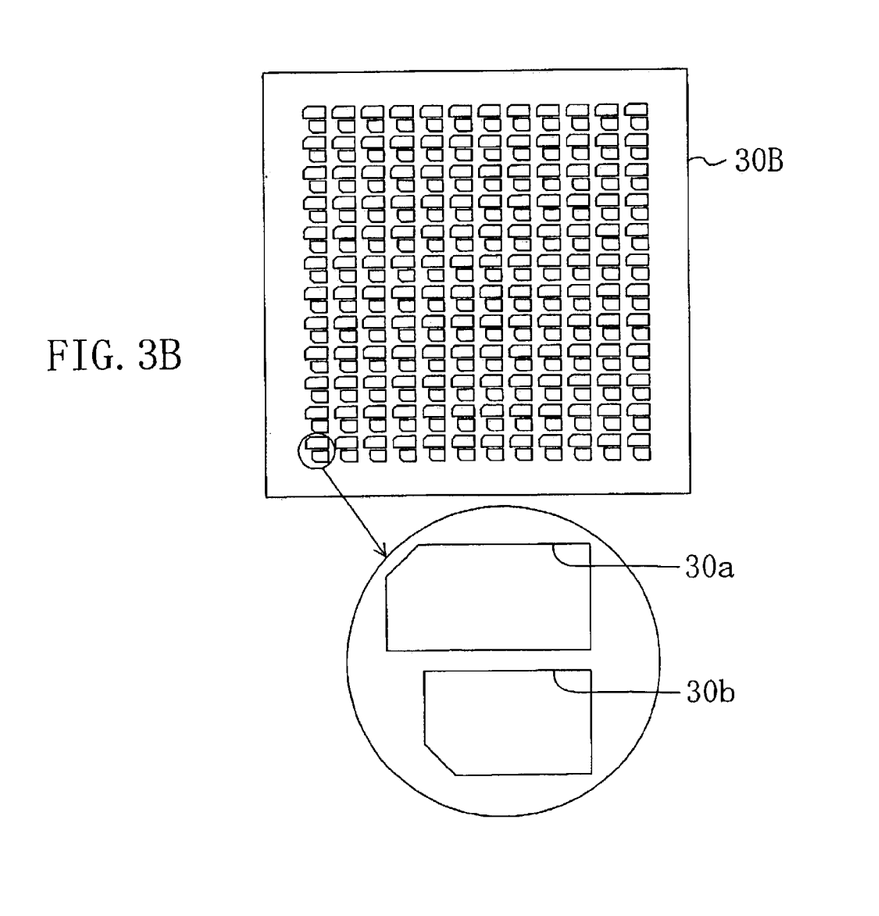
FIG. 3B is a plan view in accordance with a second modified example.

FIGS. 3A and 3B show the respective plan configurations of templates in accordance with modified examples of the template of this embodiment.

As shown in FIG. 3A, in a template 30A according to a first modified example, the length of second openings 30b for use in the positioning of the second semiconductor laser chips 12 is made smaller than the length of first openings 30a for use in the positioning of the first semiconductor laser chips 11. In this case, therefore, the length of the second semiconductor laser chips 12 themselves has to be made smaller than that of the first semiconductor laser chips 11. Accordingly, in the first modified example, the first and second semiconductor laser chips 11 and 12 are prevented from being mounted in opposite relation to each other.

In a template 30B according to a second modified example, as shown in FIG. 3B, the length of second openings 30b is reduced as in the first modified example. In addition, the respective plan configurations of the openings 30a and 30b are made pentagonal by cutting off an outer corner of each rectangle, so as to have 1-fold rotational symmetry instead of 2-fold rotational symmetry. In this case, therefore, the plan configurations of the first and second semiconductor laser chips 11 and 12 have to conform to the shapes of the openings 30a and 30b, respectively. In this manner, a set of the first semiconductor laser chips 11 are mounted onto locations in the substrate 10 that are uniquely determined therefor, and so are a set of the second semiconductor laser chips 12.

In a typical high-output laser chip, a laser output (power) value on the laser-emitting facet side thereof is greatly different from a laser output value on the rear facet side. The laser-emitting facet and the rear facet thus have to be positively distinguished from each other.

Therefore, in this embodiment, the first and second semiconductor laser chips 11 and 12 are formed so that the plan configurations of their portions that are settled into the respective openings 30a and 30b formed in the template 30 lose point symmetry, and at the same time the shapes (sizes) of the first and second openings 30a and 30b are made different from each other.

As an example, it will be described how to fabricate a semiconductor laser device with an array structure by using the template 30B of the second modified example to mount semiconductor laser chips.

FIGS. 4A through 4D are cross-sectional views illustrating process steps for mounting a plurality of semiconductor laser chips in a semiconductor-laser-device fabrication method in accordance with this embodiment.

Figure 4A:
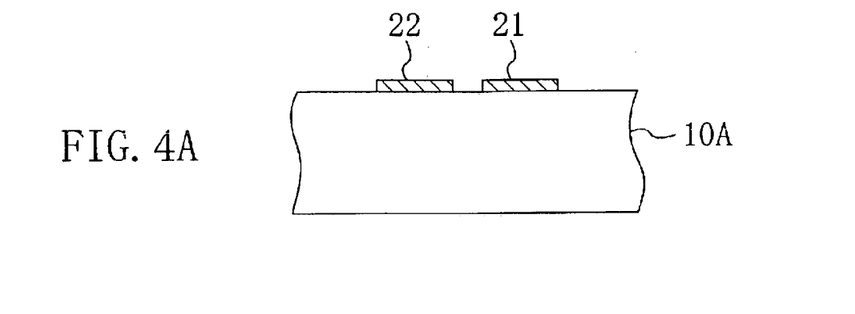
FIGS. 4A through 4D are cross-sectional views illustrating process steps in a semiconductor-laser-device fabrication method in accordance with the embodiment of the present invention.

First, as shown in FIG. 4A, first and second substrate electrodes 21 and 22 made of low-melting-point metal, such as solder material, are selectively formed on parts of the principal surface of a wafer 10A of, e.g., silicon where first and second semiconductor laser chips are to be arranged. The substrate electrode 21 and 22 may be formed by a solder printing process, for example. Or they may be formed by a lift-off technique, in which a resist pattern whose openings form an electrode pattern is formed by lithography, a low-melting-point metal is deposited over the entire surface of the resist pattern, and the resist pattern is then removed. It should be noted that only part of the wafer 10A on which one pair of the semiconductor laser chips 11 and 12 are mounted is illustrated in this embodiment.

Figure 4B:
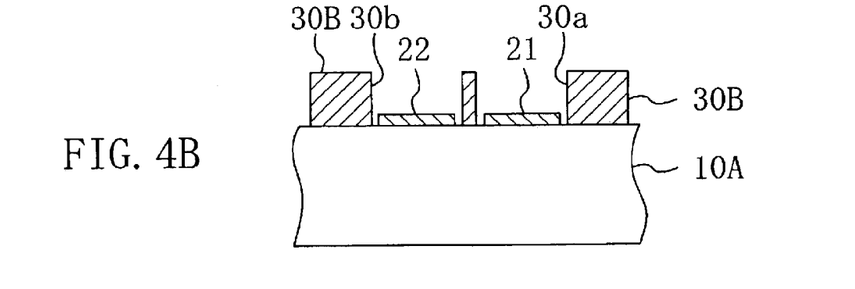

Next, as shown in FIG. 4B, a template 30B shown in FIG. 3 is positioned on the principal surface of the wafer 10A having the first and second substrate electrodes 21 and 22 formed thereon so that the first and second substrate electrodes 21 and 22 are exposed through first and second openings 30a and 30b formed in the template 30B, respectively, and the template 30B is held on the principal surface of the wafer 10A by mechanical control.

In this embodiment, after the substrate electrodes 21 and 22 have been formed on the wafer 10A, the template 30B is held on the principal surface of the wafer 10A. Instead, the template 30B may be held on the wafer 10A first, and thereafter the substrate electrodes 21 and 22 may be formed on respective parts of the wafer 10A surface which are exposed through the openings 30a and 30b of the template 30B. This is preferable because the substrate electrodes 21 and 22 on the wafer 10A and the corresponding openings 30a and 30b of the template 30B do not have to be aligned with each other.

Subsequently, the first and second semiconductor laser chips 11 and 12 in the form of functions blocks are sequentially settled into the first and second openings 30a and 30b of the template 30B, respectively, by a FSA technique.

In the FSA technology, function blocks are dispersed into a fluid (medium) such as water ($H_2O$) or methyl alcohol ($CH_3OH$). In the case of assembling a two-wavelength laser chip array, openings therefore preferably have different shapes like the first and second openings 30a and 30b formed in the template 30B.

In mounting the semiconductor laser chips 11 and 12 that have been so formed as to differ from each other in plan configuration, it is desirable that the laser chips having a larger plan dimension, that is, the first semiconductor laser chips 11 are settled into first. If the second semiconductor laser chips 12 whose plan dimension is smaller are engaged first, the second semiconductor laser chips 12 would be settled into the first openings 30a as well, which have a larger plan dimension than the second semiconductor laser chips 12.

Now, equipment for mounting the semiconductor laser chips 11 and 12 onto the substrate by a FSA technique will be briefly described.

Figure 5:
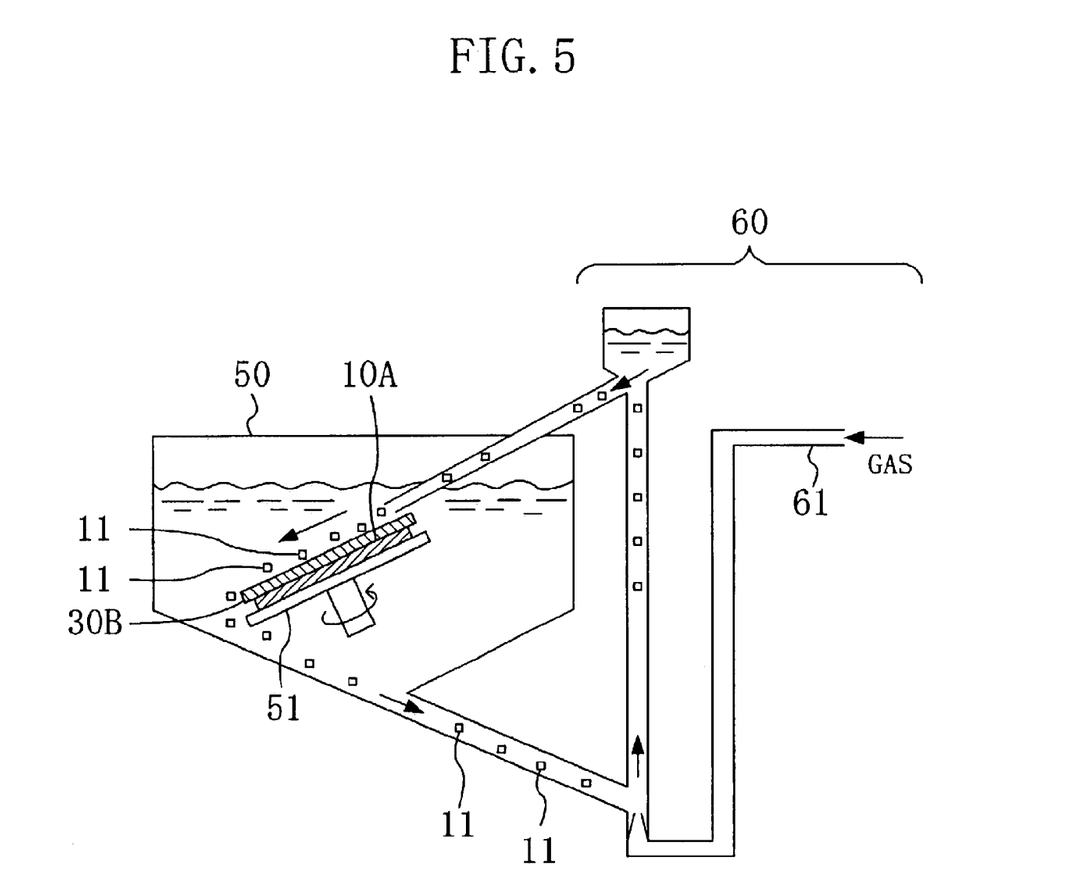
FIG. 5 schematically shows the configuration of assembly equipment used in a semiconductor-laser-device fabrication method in accordance with the embodiment of the present invention.

FIG. 5 schematically shows equipment for mounting a plurality of semiconductor laser chips 11 and 12 that have been formed into function blocks.

As shown in FIG. 5, the mounting equipment in accordance with this embodiment includes a receptacle 50, a wafer holder 51, and a pump 60. The receptacle 50 is used to contain a fluid in the form of slurry, in which a plurality of semiconductor laser chips in the form of function blocks have been dispersed. The wafer holder 51 provided on the bottom of the receptacle 50 is capable of rotating and used to hold a wafer 10A on its upper face. The pump 60 circulates the fluid in the form of slurry. The upper face of the wafer holder 51 is located slantingly with respect to the surface of the fluid.

The pump 60 is provided so that the fluid in the form of slurry is circulated in the receptacle 50 by introduction of a nitrogen gas, for example, from a gas inlet portion 61, and that the circulated fluid is poured over the upper face of the wafer holder 51.

Subsequently, a wafer 10A having a template 30B thereon is held on the wafer holder 51. In the template 30B, a plurality of first and second openings 30a and 30b are formed.

Thereafter, with the wafer holder 51 being rotated in its wafer-holding plane, a fluid in the form of slurry, in which a plurality of semiconductor laser chips 11 have been dispersed, is poured over the principal surface of the wafer 10A that is held on the upper face of the wafer holder 51 in a slanting position. In this manner, the first semiconductor laser chips 11 are settled into the respective first openings 30a formed in the template 30B. Since the fluid in the form of slurry is circulated by the pump 60, the first semiconductor laser chips 11 which are not disposed into the first openings 30a can be collected and reused any number of times. In this embodiment, since the wafer 10A held in the fluid is rotated in its principal surface, the first semiconductor laser chips 11 can be effectively engaged into the first openings 30a in the template 30B.

Figure 4C:
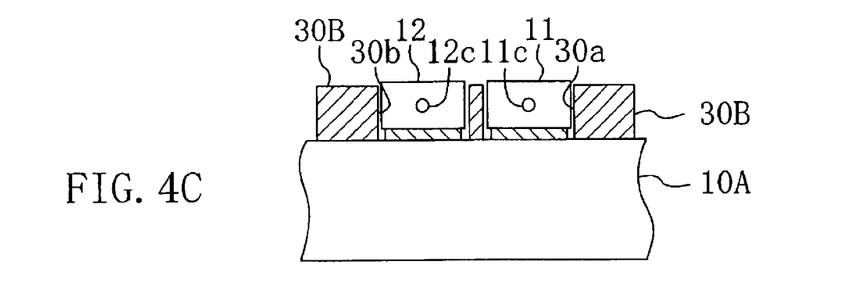
Figure 4D:
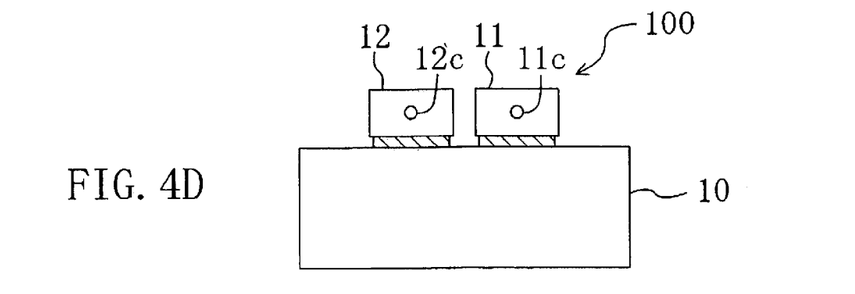

Then, after it is confirmed that the mounting of the semiconductor laser chips 11 onto the first openings 30a of the template 30B has been completed, a fluid in the form of slurry, in which a plurality of second semiconductor laser chips 12 in the form of function blocks have been dispersed, is used this time so that the second semiconductor laser chips 12 are engaged with the respective second openings 30b formed in the template 30B, thereby resulting in the state shown in FIG. 4C. Following this, the first and second substrate electrodes 21 and 22 are heated such that the semiconductor laser chips 11 and 12 are secured to the wafer 10A. The template 30B is then removed from the wafer 10A.

Next, the wafer 10A is cut using a dicing saw, for example, along dicing lines (not shown) that define the semiconductor laser devices in the wafer 10A. In this manner, each semiconductor laser device is cut from the wafer 10A, thereby obtaining the semiconductor laser device 100 shown in FIG. 4D.

As described above, in this embodiment, the semiconductor laser chips 11 and 12, which differ from each other in emission wavelength and have been formed into the function blocks, are arranged so that the respective laser-emitting directions are parallel with each other. This enables the respective laser emitting portions 11c and 12c of the semiconductor laser chips 11 and 12 to self-align, such that wavefront aberration created in the optical system for the laser beam can be reliably reduced.

In addition, since the semiconductor-laser-device fabrication method of this embodiment involves the FSA technology that permits the semiconductor laser chips 11 and 12 to be positioned in a self-aligned manner, the mounting process is simplified significantly. Furthermore, since only the semiconductor laser chips 11 and 12 that have been determined as being non-defective can be mounted, the cost of the semiconductor laser device 100 can be reduced while yields increases.

Moreover, this embodiment is characterized in that a recess structure into which the semiconductor laser chips 11 and 12 are engaged for positioning is not formed in the wafer 10A onto which the chips 11 and 12 are mounted. This eliminates the need for performing a process step for forming such a recess structure in the wafer 10A, which therefore exceptionally increases throughput in the mounting process.

As a substitution for the process step for forming a recess structure in the wafer 10A, which is no longer have to be performed, it is necessary to perform a process step for making, e.g., the template 30 for determining the mounting positions of the semiconductor laser chips. However, the template, once made, is capable of being used repeatedly. Also in this respect, productivity in the mounting process increases.

The present invention is not limited to semiconductor laser devices, but may be applicable to semiconductor devices in which light emitting diodes and other function elements are mounted onto a substrate.

What is claimed is:

1. A semiconductor device fabrication method comprising the steps of:
   (a) forming a template having openings that are located to correspond to a pattern in which a plurality of semiconductor elements in the form of chips are to be arranged.
   (b) forming a plurality of substrate electrodes for making the associated semiconductor elements electrically conductive, on parts of the principal surface of a substrate where the semiconductor elements are to be arranged,
   (c) holding the template on the principal surface of the substrate on which the semiconductor elements are to be arranged,
   (d) spreading the semiconductor elements into a liquid and pouring the semiconductor-element-spread liquid over the substrate on which the template is held, thereby allowing the semiconductor elements to be disposed into the respective openings in the template in a self-aligned manner, and
   (e) securing the semiconductor elements to the associated substrate electrodes, and then removing the template from the substrate.

2. The method of claim 1, wherein in the step (c), the liquid is poured with the template-holding substrate being rotated in its principal surface.

3. The method of claim 1, wherein the semiconductor elements are edge-emitting semiconductor laser elements that emit a laser beam from a facet, and in the step (a), the openings of the template are formed so that the respective emission directions of the semiconductor laser elements are aligned in one direction.

4. The method of claim 1, wherein in the step (a), the openings of the template are formed to correspond to the configurations of the semiconductor elements on the side thereof on which the semiconductor elements are disposed.

5. The method of claim 1, wherein the semiconductor elements differ from each other in configuration on the side thereof on which the semiconductor elements are disposed into the associated openings.

6. A semiconductor device fabrication method comprising the steps of:
   (a) forming a template having openings that are located to correspond to a pattern in which a plurality of semiconductor elements in the form of chips are to be arranged,
   (b) holding the template on the principal surface of a substrate on which the semiconductor elements are to be arranged, and
   (c) forming a plurality of substrate electrodes for making the associated semiconductor elements electrically conductive, on parts of the principal surface of the substrate that are exposed through the openings of the template,
   (d) spreading the semiconductor elements into a liquid and pouring the semiconductor-element-spread liquid over the substrate on which the template is held, thereby allowing the semiconductor elements to be disposed into the respective openings in the template in a self-aligned manner, and
   (e) securing the semiconductor elements to the associated substrate electrodes, and then removing the template from the substrate.

7. A semiconductor device fabrication method comprising the steps of:
   (a) forming a template having openings that are located to correspond to a pattern in which a plurality of semiconductor elements in the form of chips are to be arranged,
   (b) holding the template on the principal surface of a substrate on which the semiconductor elements are to be arranged,
   (c) spreading the semiconductor elements into a liquid and pouring the semiconductor-element-spread liquid over the substrate on which the template is held, thereby allowing the semiconductor elements to be disposed into the respective openings in the template in a self-aligned manner, and wherein
   the semiconductor elements are edge-emitting semiconductor laser elements that emit a laser beam from a facet, and in the step (a), the openings of the template are formed so that the respective emission directions of the semiconductor laser elements are aligned in one direction, and
   wherein in each of the semiconductor laser elements, optical output from a front facet is equivalent in value to optical output from a rear facet.

8. A semiconductor device fabrication method comprising the steps of:
   (a) forming a template having openings that are located to correspond to a pattern in which a plurality of semiconductor elements in the form of chips are to be arranged,
   (b) holding the template on the principal surface of a substrate on which the semiconductor elements are to be arranged, (c) spreading the semiconductor elements into a liquid and pouring the semiconductor-element-spread liquid over the substrate on which the template is held, thereby allowing the semiconductor elements to be disposed into the respective openings in the template in a self-aligned manner, wherein the semiconductor elements differ from each other in configuration on the side thereof on which the semiconductor elements are disposed into the associated openings, and wherein the semiconductor elements are semiconductor light emitters, and in the step (a), the openings of the template are formed to correspond to the configurations of the semiconductor elements on the side thereof on which the semiconductor elements are disposed, and the openings of the template differ from each other in configuration in accordance with the emission wavelengths of the semiconductor light emitters.

9. The method of claim 8, wherein the semiconductor elements are semiconductor light emitters, and in the step (a), the openings of the template differ from each other in configuration in accordance with the optical output values of the semiconductor light emitters.

* * * * *